US006798331B2

(12) United States Patent
Bower et al.

(10) Patent No.: US 6,798,331 B2
(45) Date of Patent: Sep. 28, 2004

(54) CURRENT CONTROL DEVICE

(75) Inventors: Bruce Bower, Williamsport, PA (US); Gareth Knowles, Williamsport, PA (US)

(73) Assignee: QorTek, Inc., Williamsport, PA (US)

( * ) Notice: Subject to any disclaimer, the term of this patent is extended or adjusted under 35 U.S.C. 154(b) by 248 days.

(21) Appl. No.: 10/072,587

(22) Filed: Feb. 8, 2002

(65) Prior Publication Data

US 2004/0012303 A1 Jan. 22, 2004

Related U.S. Application Data

(60) Provisional application No. 60/267,306, filed on Feb. 8, 2001.

(51) Int. Cl.[7] .................................................. H01L 10/10

(52) U.S. Cl. ............................ 338/47; 338/99; 338/101

(58) Field of Search ............................ 338/47, 99, 101

(56) References Cited

U.S. PATENT DOCUMENTS

| | | | | |
|---|---|---|---|---|
| 3,882,442 A | * | 5/1975 | Hubbard | 338/41 |
| RE28,595 E | * | 10/1975 | DuRocher | 200/265 |
| 4,028,276 A | | 6/1977 | Harden et al. | |
| 4,163,204 A | * | 7/1979 | Sado et al. | 338/114 |
| 5,378,407 A | | 1/1995 | Chandler et al. | |
| 5,614,881 A | | 3/1997 | Duggal et al. | |
| 5,644,283 A | * | 7/1997 | Grosse-Wilde et al. | 338/20 |
| 5,929,744 A | | 7/1999 | Duggal et al. | |
| 5,968,419 A | | 10/1999 | Sadhir et al. | |
| 6,128,168 A | | 10/2000 | Arnold et al. | |
| 6,144,540 A | | 11/2000 | Arnold et al. | |
| 6,157,528 A | | 12/2000 | Anthony | |

OTHER PUBLICATIONS

Shoko Yoshikawa, Toshitaka Ota, Robert Newnham, Ahmed Amin Piezoresistivity in Polmer–Ceramic Composites University Park, PA.

G.R. Ruschau, R.E. Newnham Critical Volume Fractions in Conductive Composites Journal of Composite Materials vol. 26, No. 18, 1992 pp. 2727–2735.

M. Blaskiewicz, D.S. McLachlan, R.E. Newnham Study of the Volume Fraction, Temperature, and Pressure Dependence of the Resistivity in a Ceramic–Polymer using a General Effecive Media Theory Equation Journal of Materials Science 26, 1991 pp. 5899–5903.

D.S. McLachlan, M. Blaszkiewicz, R.E. Newnham Electrical Resistivity of Composites Journal of American Ceramic Society, 1990 73 [8] 2187–2203.

* cited by examiner

*Primary Examiner*—Karl D. Easthom
(74) *Attorney, Agent, or Firm*—Michael G. Crilly, Esq.

(57) ABSTRACT

A current control device is described wherein a pressure conduction composite is compressed and decompressed to alter its conductivity and thereby current conduction through the device. The pressure conduction composite is composed of a nonconductive matrix, a conductive filler, and an additive. The invention consists of electrodes, a nonconducting isolator, and pressure plates contacting the composite. Electrically activated actuators apply a force onto pressures plates. Actuators are composed of a piezoelectric, piezoceramic, electrostrictive, magnetostrictive, and shape memory alloy materials, capable of extending and/or contracting thereby altering pressure and consequently resistivity within the composite. In an alternate embodiment, two or more current control devices are electrically coupled parallel to increase power handling.

8 Claims, 12 Drawing Sheets

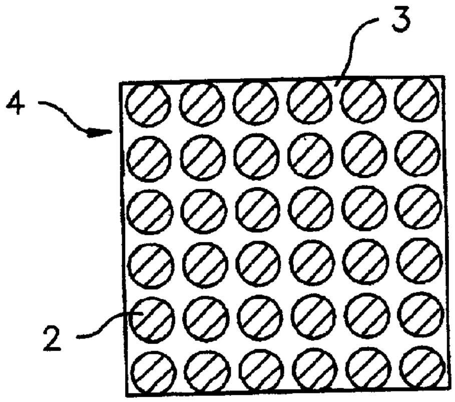
*Fig. 1A*
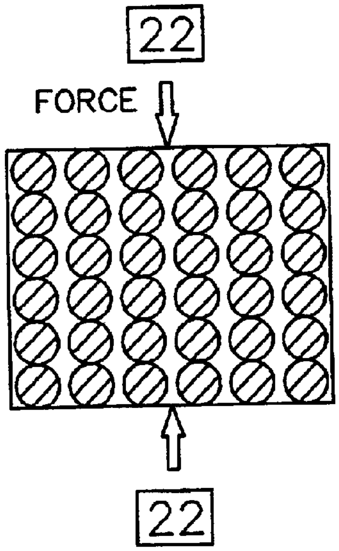
*Fig. 1B*
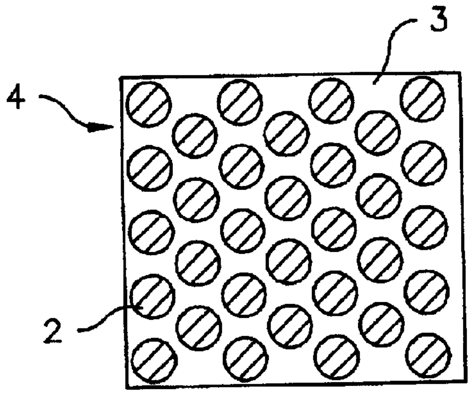
*Fig. 1C*
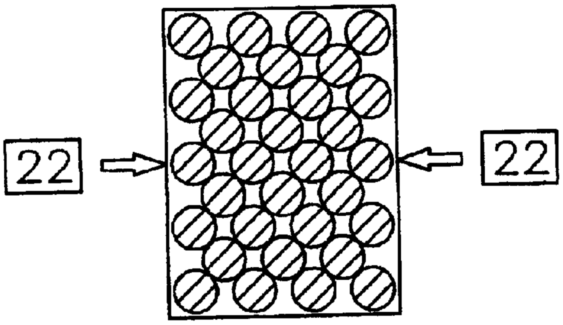
*Fig. 1D*
*Figure 1*

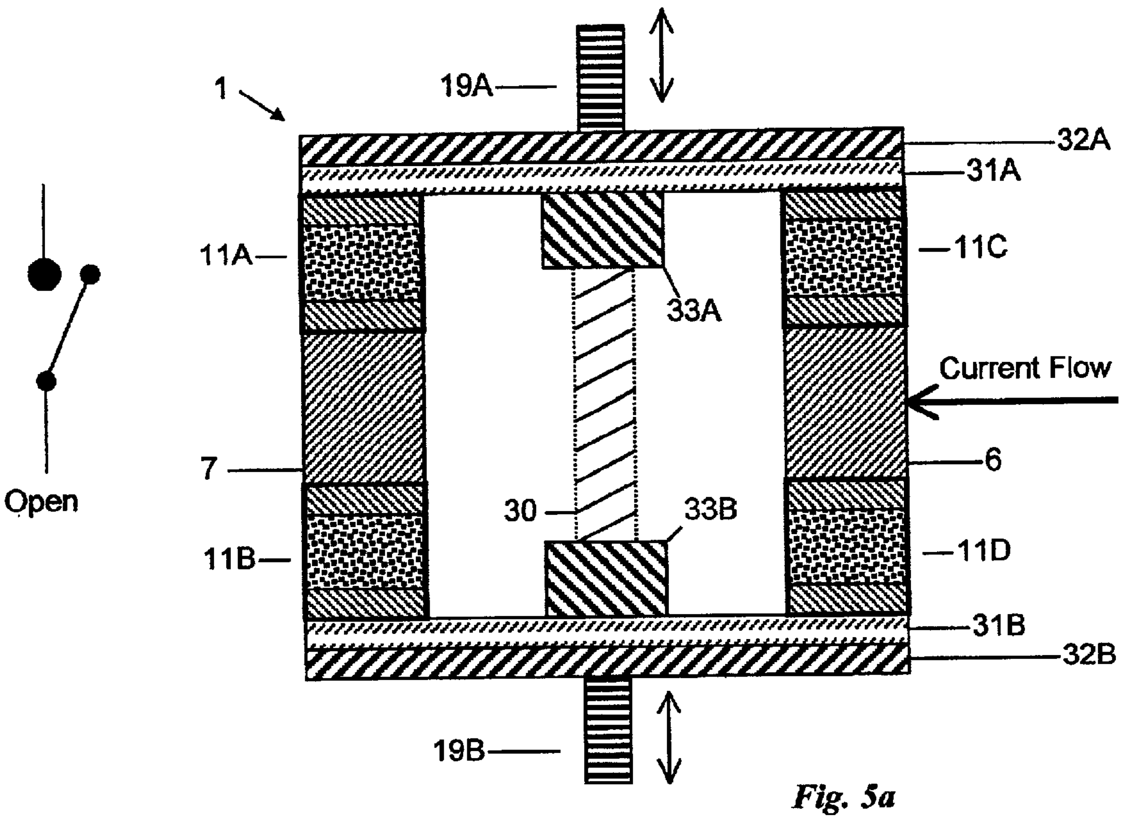
*Fig. 5a*
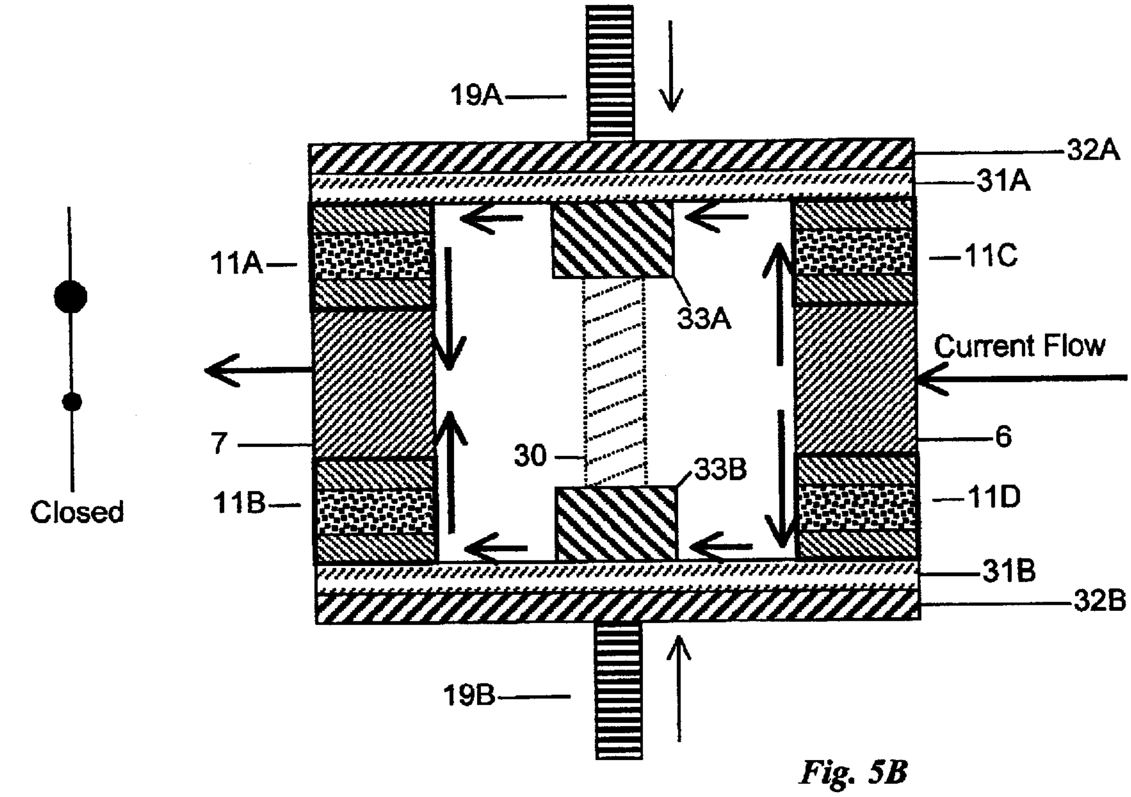
*Fig. 5B*
*Figure 5*

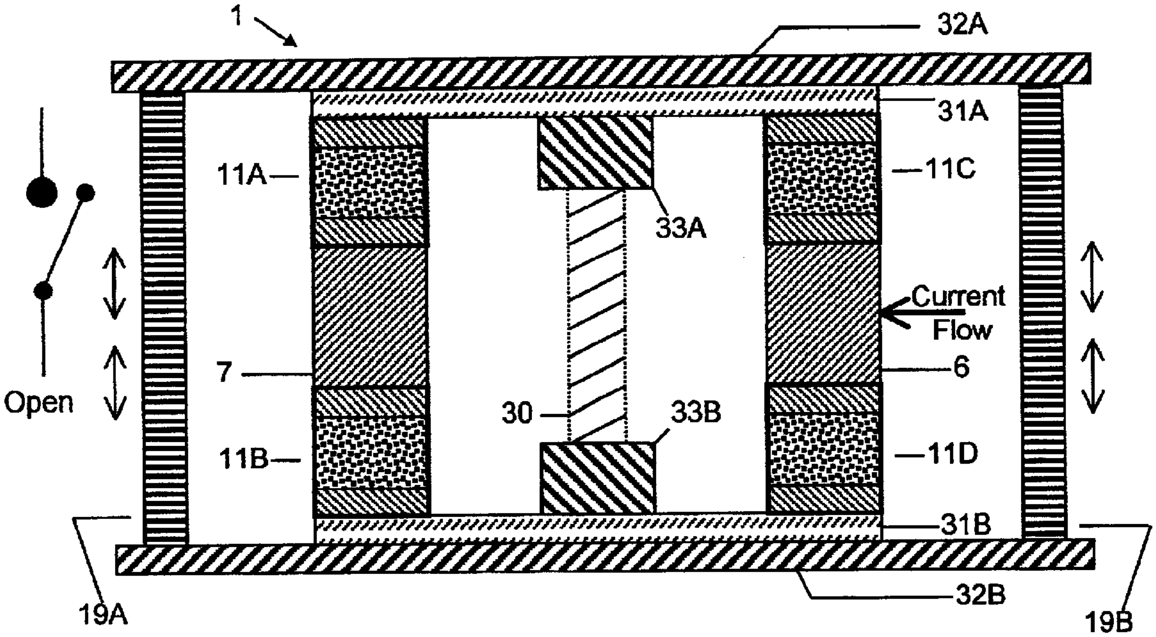
*Fig. 6a*
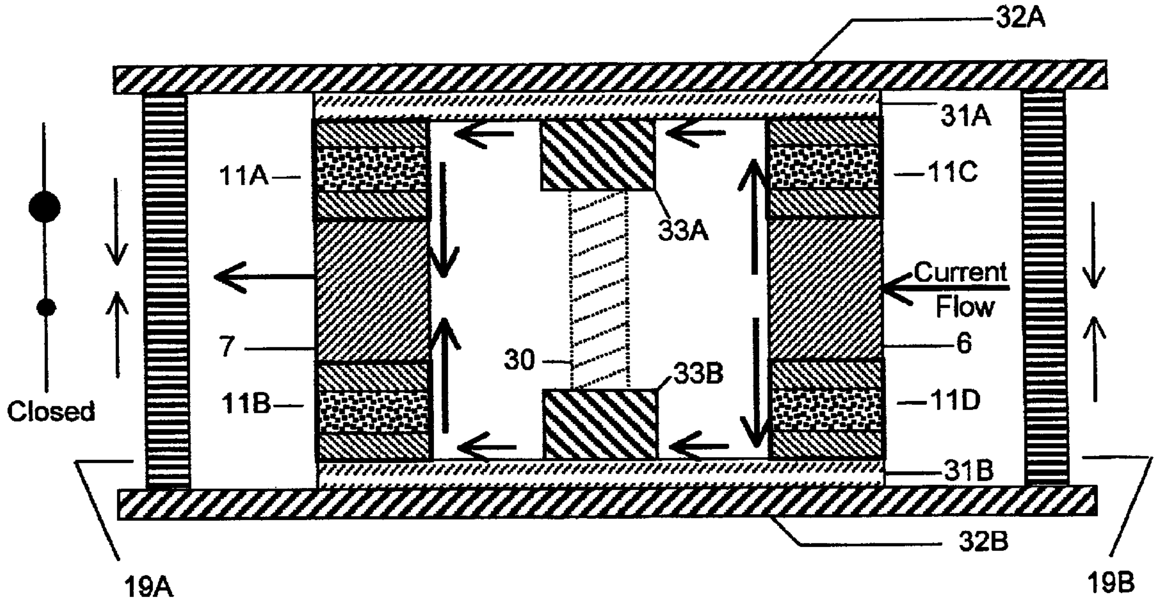
*Fig. 6B*
*Figure 6*

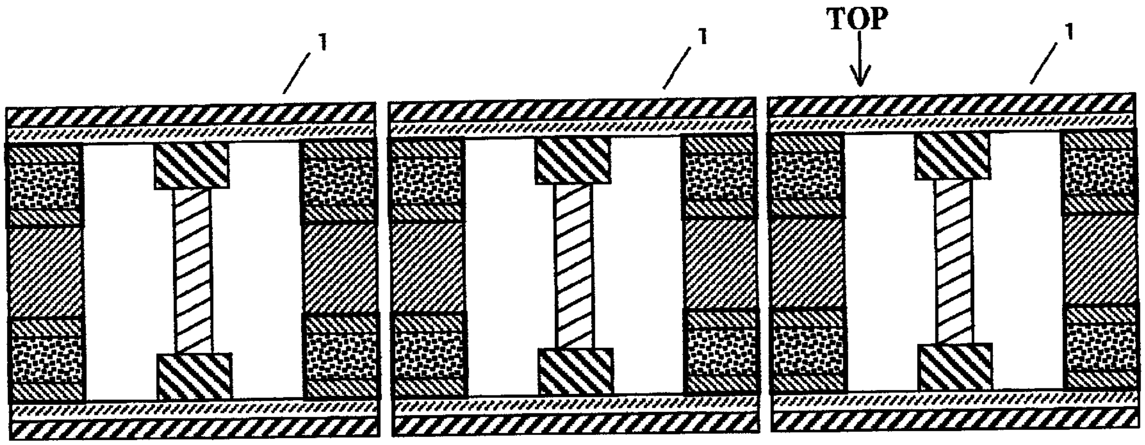
*Fig. 7A*
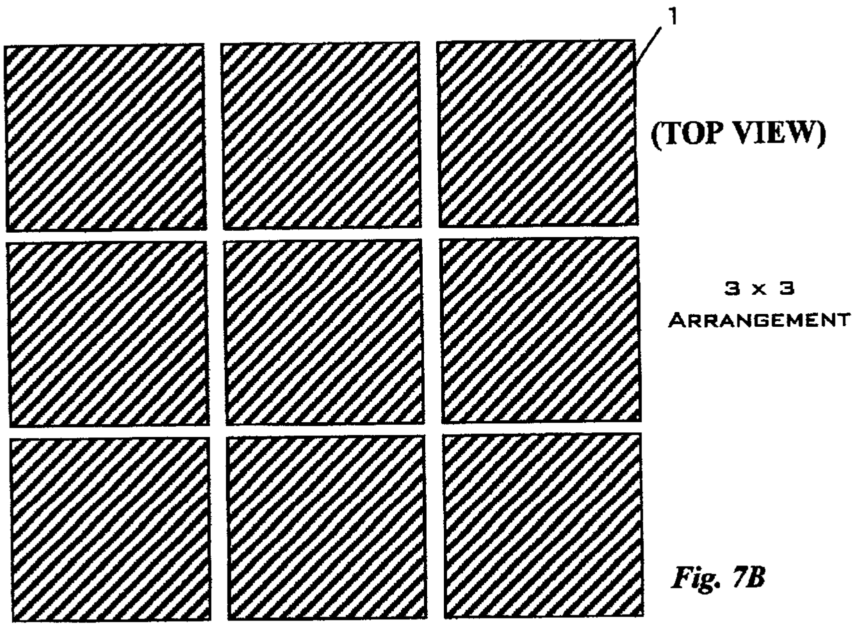
*Fig. 7B*
*Figure 7*

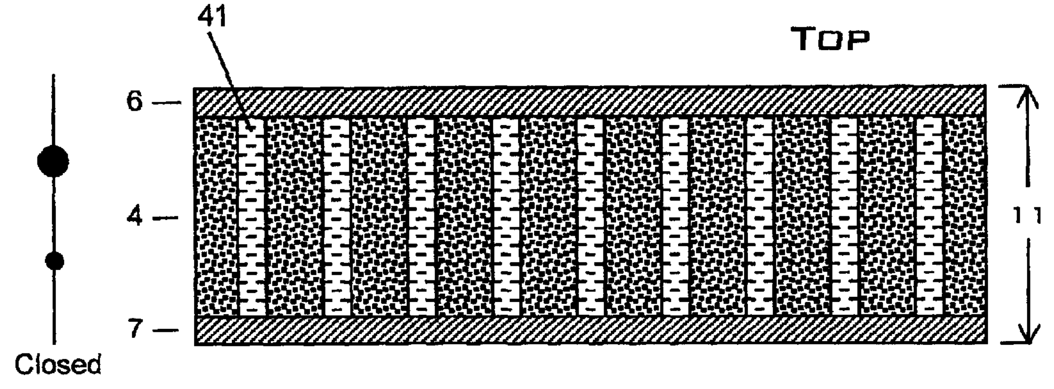
*Fig. 16A*
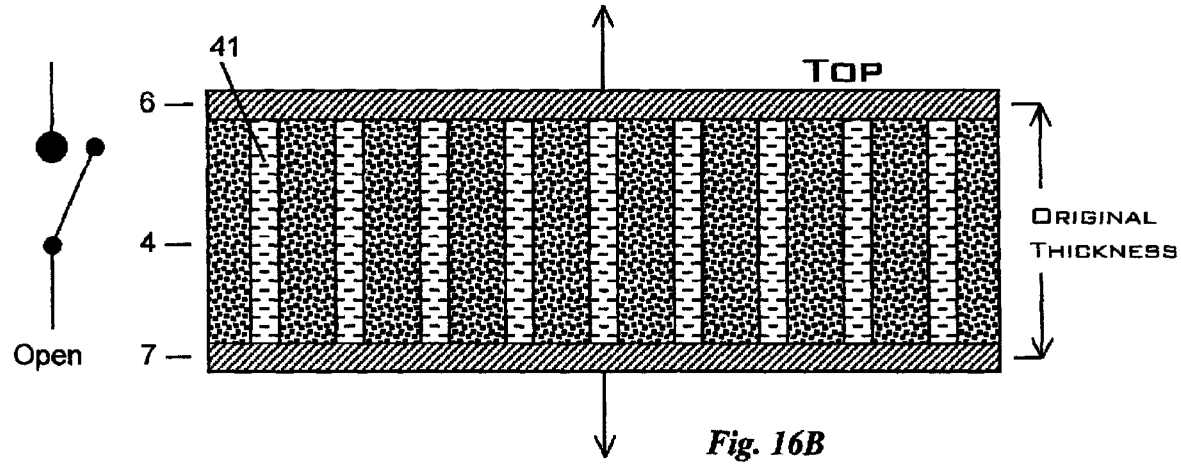
*Fig. 16B*
*Figure 16*

CURRENT CONTROL DEVICE

CROSS REFERENCE TO RELATED APPLICATIONS

The application claims benefit under 35 U.S.C. 119(e) from U.S. Provisional Application No. 60/267,306 filed on Feb. 8, 2001.

FEDERALLY SPONSORED RESEARCH OR DEVELOPMENT

This invention was made with government support under Contract No. N00024-01-C-4034 awarded by the United States Navy.

BACKGROUND OF THE INVENTION

1. Field of the Invention

The present invention generally relates to a current control device for regulating current flow. The invention specifically described is a device wherein current flow is regulated by compression and expansion of a composite.

2. Related Arts

Mechanical circuit breakers are best described as a switch wherein a contact alters the electrical impedance between a source and a load. Mechanical breakers are typically composed of a snap-action bimetal-contact assembly, a mechanical latch/spring assembly, or an expansion wire. Such devices are neither gap-less nor shock resistant, therefore prone to chatter and subject to arcing. Chatter and arcing pose substantial problems in many high-voltage applications.

Variably conductive composites are applicable to current control devices. Compositions include positive temperature coefficient resistive (PTCR), polymer current limiter (PCL), and piezoresistive formulations. PTCR and PCL applications and compositions and piezoresistive compositions are described in the related arts.

Anthony, U.S. Pat. No. 6,157,528, describes and claims a polymer fuse composed of a PTCR composition exhibiting temperature-dependent resistivity wherein low resistivity results below and high resistivity results above a transition temperature.

PTCR composites are composed of a conductive filler within a polymer matrix and an optional nonconductive filler. Chandler et al., U.S. Pat. No. 5,378,407, describes and claims a PTCR composite having a crystalline polymer matrix, a nickel conductive filler, and a dehydrated metal-oxide nonconductive filler. Sadhir et al., U.S. Pat. No. 5,968,419, describes and claims a PTCR composite having an amorphous polymer matrix, a thermoplastic nonconductive filler, and a conductive filler. During a fault, the composite heats thereby increasing volumetrically until there is sufficient separation between particles composing the conductive filler to interrupt current flow. Thereafter, the composite cools and shrinks restoring conduction. This self-restoring feature limits PTCR compositions to temporary interrupt devices.

PCL composites, like PTCR compositions, are a mixture of a conductive filler and a polymer. However, PCL composites are conductive when compressed and interrupt current flow by polymer decomposition. For example, Duggal et al., U.S. Pat. No. 5,614,881, describes a composite having a pyrolytic-polymer matrix and an electrically conductive filler. During a fault, temperature within the composite increases causing limited decomposition and evolution of gaseous products. Current flow is interrupted when separation occurs between at least one electrode and conductive polymer. Gap dependent interrupt promotes arcing and arc related transients. Furthermore, static compression of the composites increases time-to-interrupt by damping gap formation. Neither PTCR nor PCL applications provide for the dynamically-tunable compression of a composite in response to electrical load conditions.

Piezoresistive composites, also referred to as pressure conduction rev composites, exhibit pressure-sensitive resistivity rather than temperature or decomposition dependence. Harden et al., U.S. Pat. No. 4,028,276, describes piezoresistive composites composed of an electrically conductive filler within a polymer matrix with an optional additive. Conductive particles comprising the filler are dispersed and separated within the matrix, as shown in FIGS. 1A and 1C. Consequently, piezoresistive composites are inherently resistive becoming less resistive and more conductive when compressed. Compression reduces the distance between conductive particles thereby forming a conductive pathway, as shown in FIGS. 1B and 1D. The composite returns to its resistive state after compressive forces are removed. However, piezoresistive compositions resist compression.

Pressure-based interrupt facilitates a more rapid regulation of current flow as compared to PTCR and PCL systems. Temperature dependent interrupt is slowed by the poor thermal conduction properties of the polymer matrix. Decomposition dependent interrupt is a two-step process requiring both gas evolution and physical separation between electrode and composite. Furthermore, decomposition limits the life cycle of a composition.

Active materials, including but not limited to piezoelectric, piezoceramic, electrostrictive, magnetostrictive, and shape-memory alloy materials, are ideally suited for the controlled compression of piezoresistive composites thereby achieving rapid and/or precise changes to resistivity. Active materials facilitate rapid movement by mechanically distorting or resonating when energized. High-bandwidth active materials are both sufficiently robust to exert a large mechanical force and sufficiently precise to controllably adjust force magnitude.

As a result, an object of the present invention is to provide a current control device tunably and rapidly compressing a pressure-dependent conductive composite. A further object of the present invention is to provide a device that eliminates arcing thereby facilitating a complete current interrupt. It is an additional object of the present invention to provide a device that quenches transient spikes associated with shut off.

SUMMARY OF THE INVENTION

The present invention is a current control device controlling current flow via the tunable compression of a polymer-based composite in response to electrical load conditions. The invention includes a pressure conduction composite compressed by at least one pressure plate. In several embodiments, the composite is compressed by a conductive pressure plate. In other embodiments, the composite is compressed by a nonconductive pressure plate and current flow occurs between two electrodes contacting the composite. The composite is variably-resistive and typically composed of a conductive filler, examples including metals, metal-nitrides, metal-carbides, metal-borides, metal-oxides, within a nonconductive matrix, examples including polymers and elastomers. Optional additives typically include oil, preferably silicone-based.

A compression mechanism applies, varies, and removes a compressive force acting on the composite. Compression mechanisms include electrically driven devices comprised of actuators composed of an active material extending and/or contracting when energized. Active materials include piezoelectric, piezoceramic, electrostrictive, magnetostrictive and shape memory alloys. Piezo-controlled pneumatic devices are also appropriate. Actuator movement adjusts the pressure state within the composite thereby altering resistivity within the confined composite.

Several advantages are offered by the present invention. Compression-based control of a pressure-sensitive conduction composite provides a nearly infinite life cycle. A gapless interrupt eliminates arcing and arc quenching requirements. The present invention lowers fault current thereby avoiding stress related chatter. Parallel arrangements of the present invention offer power handling equal to the sum of the individual units.

BRIEF DESCRIPTION OF THE DRAWINGS

The invention will now be described in more detail, by way of example only, with reference to the accompanying drawings, in which:

FIG. 1 is a schematic diagram showing exemplary microstructures for composites before and after compression.

FIG. 5 is a side elevation view of a current controller comprised of four pressure switches wherein pressure plates are pushed by actuators.

FIG. 6 is a side elevation view of a current controller comprised of four pressure switches wherein pressure plates are pulled by actuators.

FIG. 7 shows a parallel arrangement of current controllers comprising a single unit.

FIG. 16 is a section view of pressure switch showing cylindrical holes filled with a temperature sensitive material.

REFERENCE NUMERALS

Figure 2:
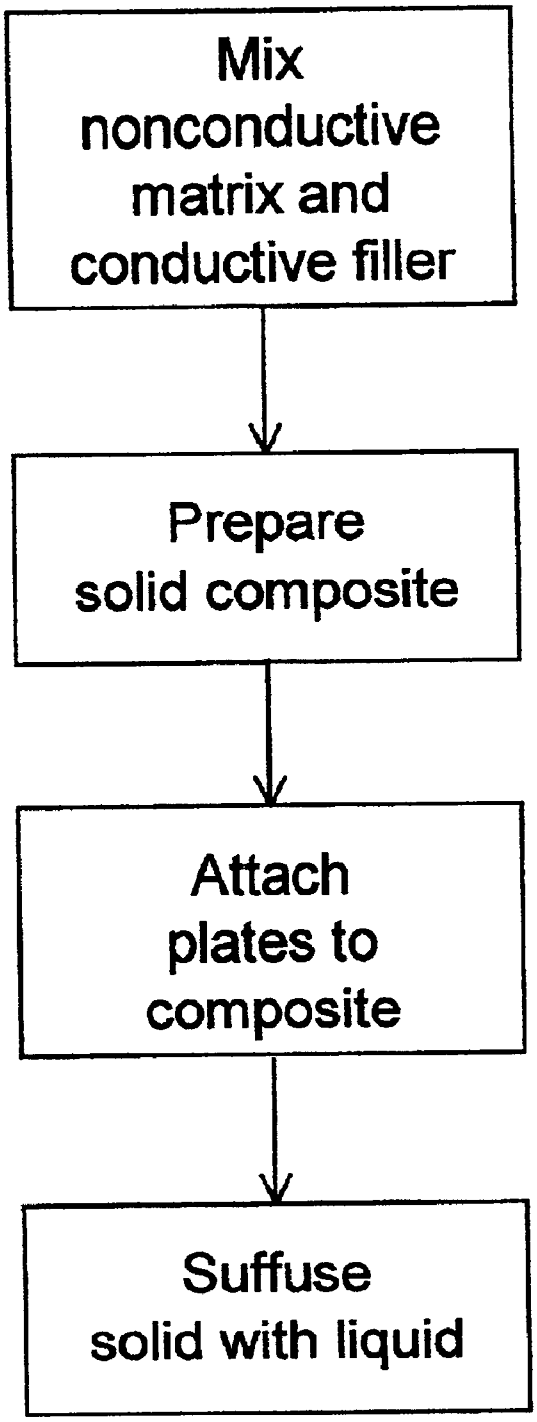
FIG. 2 is a flowchart of composite manufacturing method.

1 Current controller
2 Conductive filler
3 Nonconductive matrix
4 Composite
5 Isolator
6 First electrode
7 Second electrode
8 Slider
9 Channel
10 Terminal end
1 Pressure switch
12 Cavity
16 Compression mechanism
18 Pressure plate
19 Actuator
20 First end
21 Second end
22 Force
23 Guide
25 Band
30 Restoration element
31 Conductor
32 Insulator
33 Insulator
40 Hole
41 Temperature sensitive material
50 Mechanical spring
51 Temperature sensitive actuator
52 Wire
53 Wire
54 Nonconducting terminal
55 Rigid element
56 Thermal element

DESCRIPTION OF THE INVENTION

Figure 3:
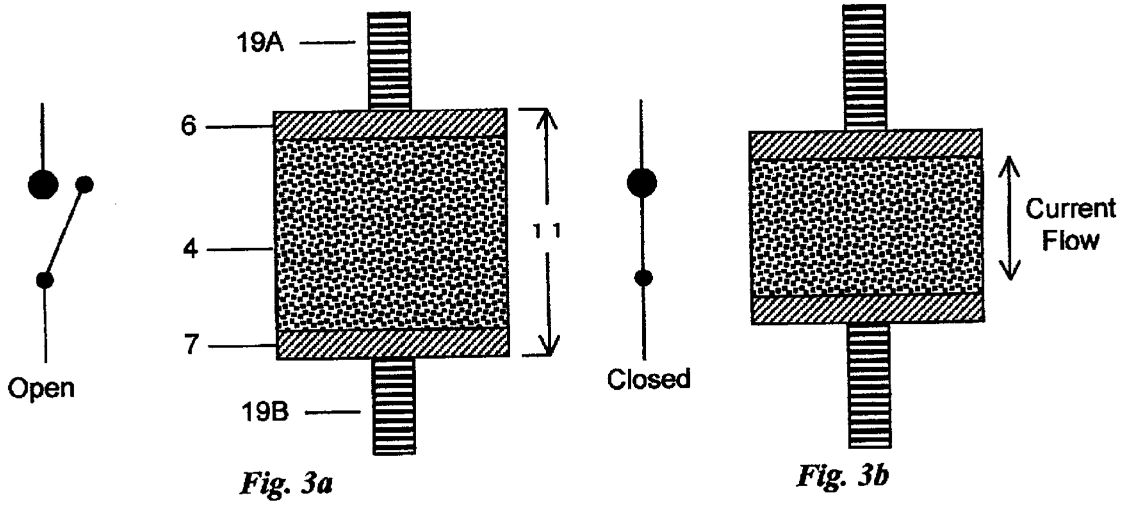
FIG. 3 is a side elevation view of a pressure switch with conductive pressure plates.
Figure 4:
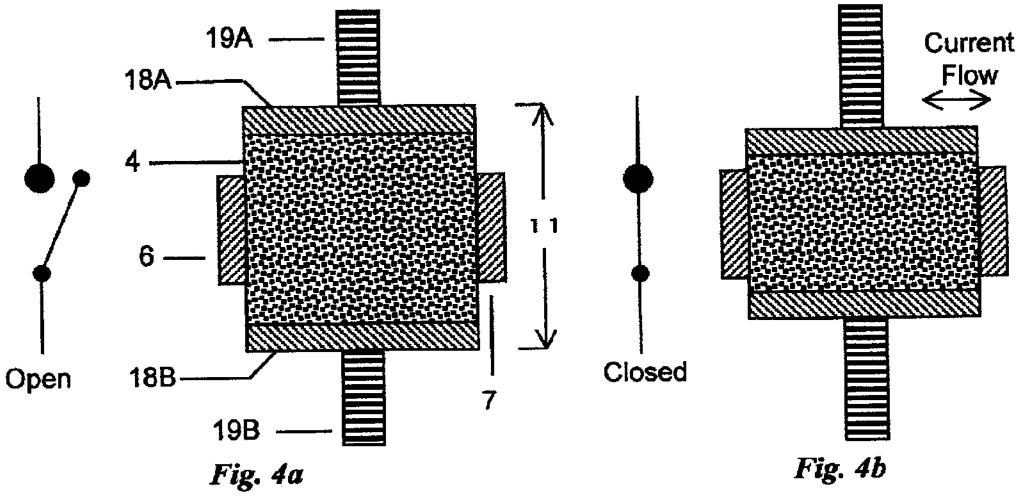
FIG. 4 is a side elevation view of a pressure switch with nonconductive pressure plates.

Two embodiments of the present invention are comprised of a rectangular solid composite 4 contacting and sandwiched between two or more plates, namely a planar first electrode 6 and a planar second electrode 7, as shown in FIG. 3, and a planar first electrode 6 and a planar second electrode 7 and two planar pressure plates 18*a*, 18*b*, as shown in FIG. 4. A pressure switch 11 is comprised of a composite 4 and electrodes 6, 7 as shown in FIG. 3 or a composite 4 and pressure plates 18*a*, 18*b* as shown in FIG. 4.

The composite 4 functionally completes the current path between first electrode 6 and second electrode 7 during acceptable operating conditions and interrupts current flow when a fault condition occurs. The composite 4 is either conductive or resistive based on the pressure state within the composite 4. For example, the composite 4 may be conductive above and nonconductive below a threshold pressure. Alternately, the resistivity of the composite 4 may vary with pressure over a range of resistance values.

A typical composite 4 is a pressure dependent conductive material, for example a piezoresistive formulation, comprised of a nonconductive matrix 3 and a conductive filler 2, as schematically shown in FIG. 1. Preferred mixtures have a volume fraction below the percolation threshold wherein conductive filler 2 is randomly dispersed within the nonconductive matrix 3. During compression, the nonconductive matrix 3 between conductive filler 2 particles is dimensional reduced thereby crossing the percolation threshold.

The nonconductive matrix 3 is a resistive, yet compressible material including but not limited to polymers and elastomers. Specific examples include polyethylene, polystyrene, polyvinyldifluoride, polyimide, epoxy, polytetrafluorethylene, silicon rubber, polyvinylchloride, and combinations thereof Preferred embodiments are comprised of the elastomer RTV R3145 manufactured by the Dow Corning Company.

The conductive filler 2 is an electrically conductive material including but not limited to metals, metal-based oxides, nitrides, carbides, and borides, and carbon black. Preferred fillers resist deformation under compressive loads and have a melt temperature sufficiently above the thermal conditions generated during current interrupt. Specific metal examples include aluminum, gold, silver, nickel, copper, platinum, tungsten, tantalum, iron, molybdenum, hafnium, combinations and alloys thereof Other example fillers include Sr(Fe, Mo)O3, (La,Ca)MnO3, Ba(Pb,Bi)O3, vanadium oxide, antimony doped tin oxide, iron oxide, titanium diboride, titanium carbide, titanium nitride, tungsten carbide, and zirconium diboride.

FIG. 2 describes a fabrication method for various composites 4. Generally, composites 4 are prepared from high-purity feedstock, mixed, formed into a solid, and suffused with oil. One or more plates are adhered to the composite 4.

Feedstocks include both powders and liquids. Conductive filler 2 feedstock is typically composed of a fine, uniform powder, one example being 325 mesh titanium carbide. Nonconductive matrix 3 feedstock may include either a fine, uniform powder or a liquid with sufficiently low-viscosity to achieve adequate dispersion of powder. Powder-based formulations are mechanically mixed and compression molded using conventional methods. Polytetrafluorethylene formulations may require sintering within an oven to achieve a structurally durable solid. Powder-liquid formulations, one example being titanium carbide and a silicone-based elastomer, are vulcanized and hardened within a die under low uniaxial loading at room temperature.

The solid composite 4 is placed within a liquid bath thereby allowing infiltration of the additive into the solid. Additives are typically inorganic oils, preferably silicone-based. The composite 4 is exposed to the additive bath to insure complete suffusion of the solid, whereby exposure time is determined by dimensions and composition of the composite 4. For example, a 0.125-inch by 0.200-inch by 0.940-inch composite 4 composed of titanium carbide having a volume fraction of 66 percent and RTV R3145 having a volume fraction of 34 percent was suffused over a 48 hour period.

Conductive or nonconductive plates are adhered to the composite 4 either before or after suffusion. If prior to suffusion, plates are placed within the die along with the liquid state composite 4. For example, a silicone elastomer composite 4 is adequately bonded to two 0.020-inch thick brass plates by curing at room temperature typically between 3 to 24 hours or at an elevated temperature between 60 to 120 degrees Celcius for 2 to 10 hours. If after suffusion, silicone adhesive is applied between plate and composite 4 and thereafter mechanically pressed to allow for proper bond formation.

A porous, nonconductive matrix 3 improves compression and cooling characteristics of the composite 4 without degrading electrical properties. A porous structure is formed by mechanical methods, one example including drilling, after fabrication of the solid composite 4. Another method includes the introduction of pores during mixing of a powder-based conductive filler 2 with a liquid-based nonconductive matrix 3. An additional method includes the introduction of pores during compression forming the composite 4. Also, pores are formed by heating the composite 4 within an oven resulting in localized heating or phase transitions that result in void formation and growth. Furthermore, highly compressible microspheres composed of a low-density, high-temperature foam may be introduced during mixing. Pores are either randomly oriented or arranged in a repeating pattern. Pore shapes include but are not limited to spheres, cylinders, and various irregular shapes. A single pore may completely traverse the thickness of a composite 4.

Figure 13:
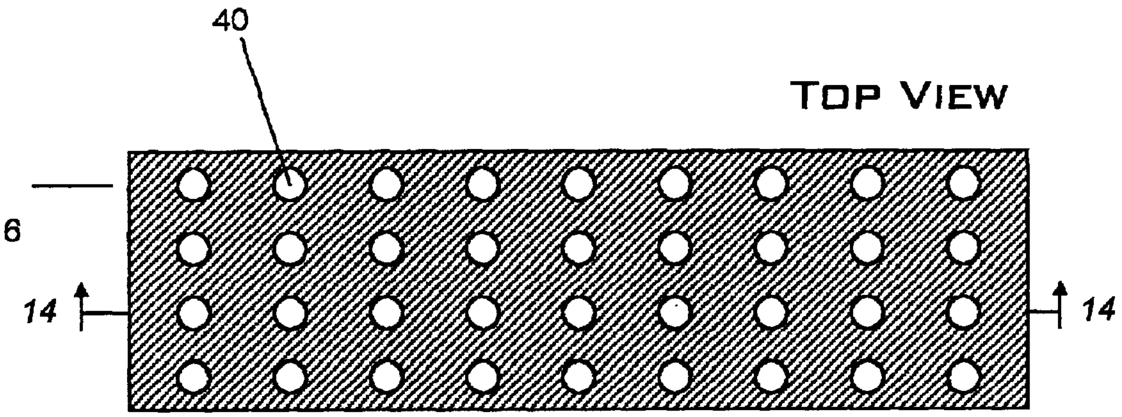
FIG. 13 is a top elevation view of pressure switch showing cylindrical pores oriented through electrodes.
Figure 14:
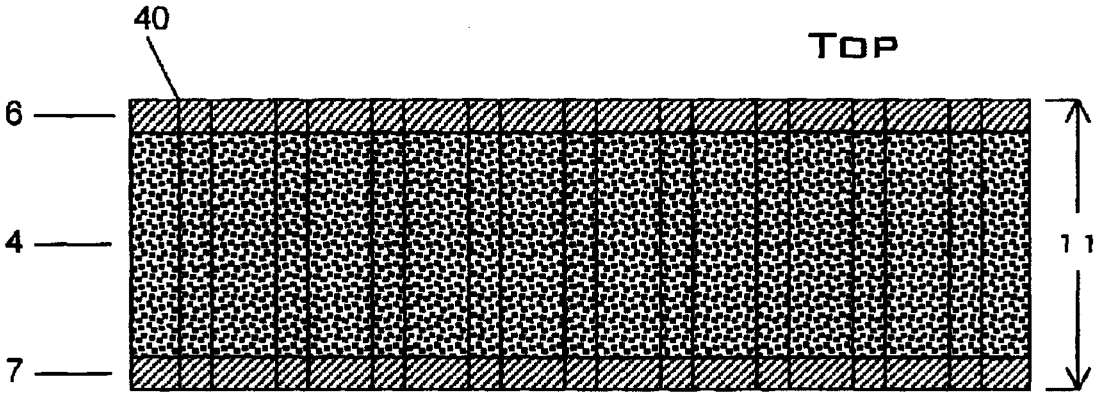
FIG. 14 is a section view of pressure switch showing cylindrical holes through switch thickness.
Figure 15:
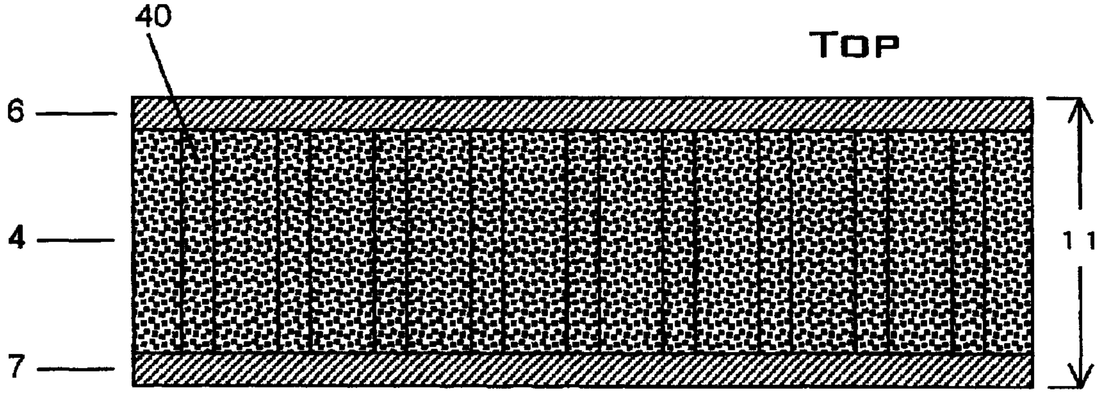
FIG. 15 is a section view of pressure switch showing cylindrical holes within composite.

FIGS. 13 and 14 show an embodiment wherein a plurality of holes 40 traverse the cross section of a pressure switch 11. FIG. 15 shows an embodiment wherein holes traverse the composite 4 within the pressure switch 11.

FIG. 16 shows a further embodiment wherein holes 40 are filled with a temperature sensitive material 41, examples including rods or springs composed of a shape memory alloy. Functionally, the temperature sensitive material 41 is typically a rubbery material below, see FIG. 16*a*, and hard above, see FIG. 16*b*, a phase transition temperature. More importantly, the temperature sensitive material 41 produces a large force above a transition temperature designed within the material as readily understood within the art. This force is sufficiently capable of moving the pressure plates 18 or electrodes 6,7 apart and interrupting current flow. The temperature sensitive material 41 is self restoring thereby facilitating current flow after the surrounding composite 4 has cooled.

Figure 17:
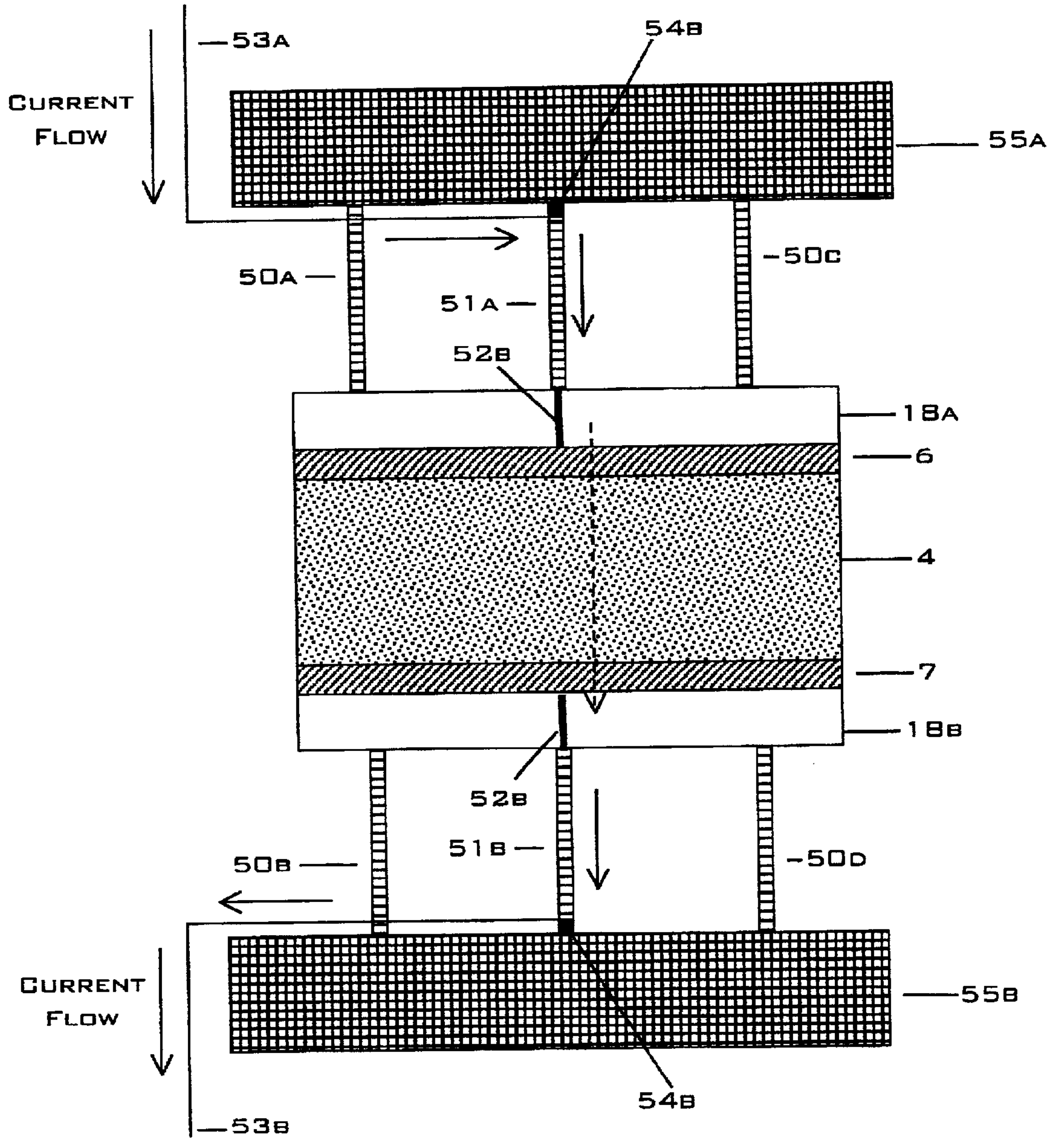
FIG. 17 is a side elevation view of temperature activated switch.
Figure 18:
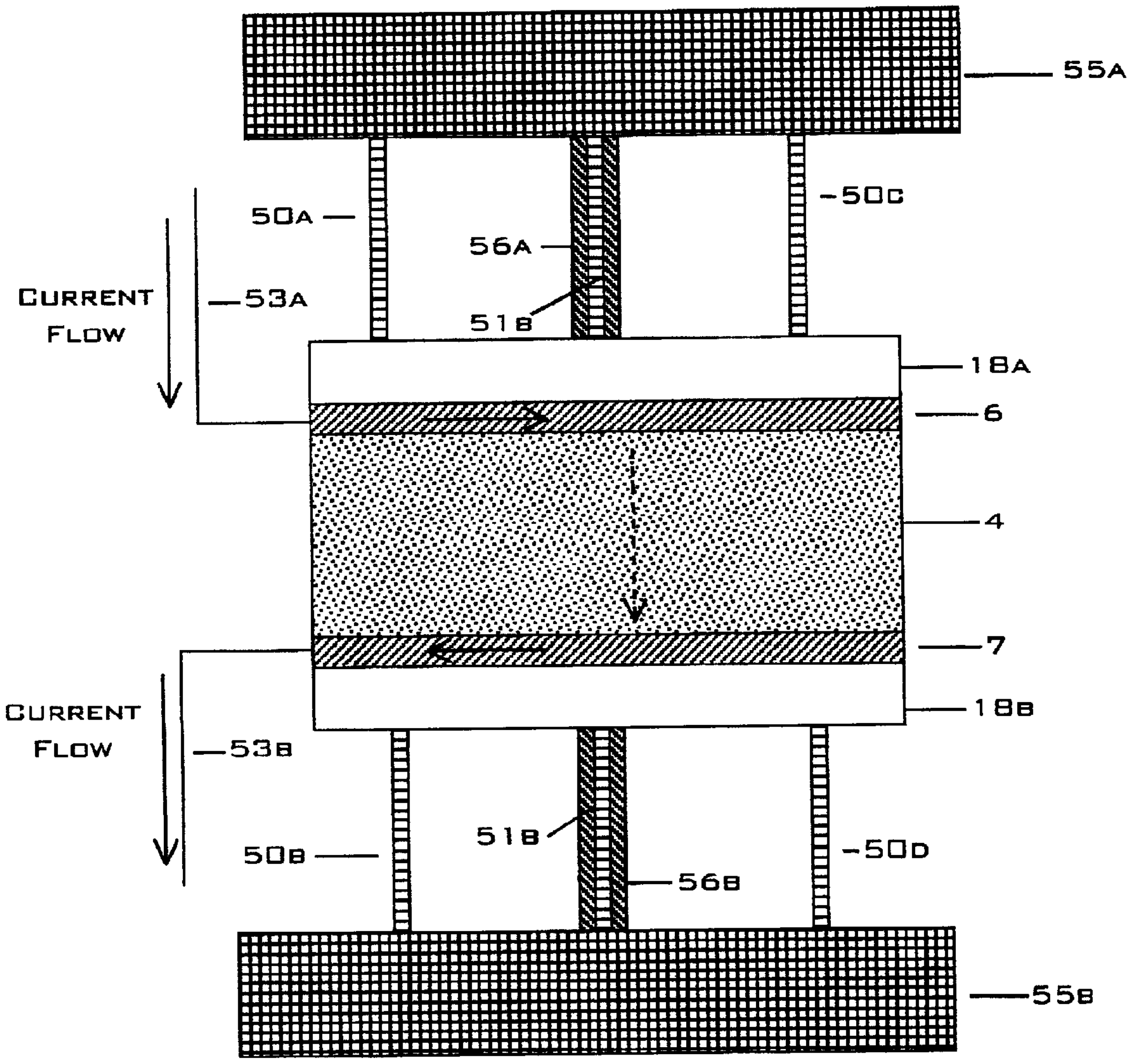
FIG. 18 is a side elevation view of temperature activated switch.

FIGS. 17 and 18 show two embodiments wherein at least two temperature sensitive actuators 51 apply a compressive force 22 onto a composite 4 thereby allowing current flow. In FIG. 17, current flows directly through the temperature sensitive actuators 51*a*, 51*b*, preferably a shaped memory alloy. When a fault occurs the temperature sensitive actuators 51*a*, 51*b* are heated and contract thereby decompressing the composite 4 and interrupting current. The composite 4 is compressed as the temperature sensitive actuator 51 cools. In FIG. 18, current flows through the first electrode 6 and the second electrode 7 when temperature sensitive actuators 51*a*, 51*b* are heated by thermal elements 56*a*, 56*b*. Thermal elements 56*a*, 56*b* are deactivated when a fault condition occurs thereby decreasing the length of the temperature sensitive actuators 51*a*, 51*b* and reactivated after the fault condition is corrected thereby increasing the length of the temperature sensitive actuators 51*a*, 51*b* causing compression of the composite 4 and current flow.

FIGS. 5 and 6 show additional embodiments of the present invention comprised of four pressure switches 11*a*, 11*b*, 11*c*, 11*d*, a first electrode 6, a second electrode 7, two planar conductors 31*a*, 31*b*, four insulators 32*a*, 32*b*, 33*a*, 33*b*, a restoration element 30, and a pair of actuators 19*a*, 19*b*.

Pressure switches 11*a*, 11*b*, 11*c*, 11*d* are composed of a pressure conduction composite 4 disposed between and adhered to two electrically conducting plates, as described above. A pair of pressure switches 11 are electrically aligned in a serial arrangement about a single electrode, either the first electrode 6 or the second electrode 7. One electrically conducting plate from each pressure switch 11 directly contacts the electrode. Two such pressure switch 11 and electrode arrangements are thereafter aligned parallel and disposed between, perpendicular to and contacting a pair of conductors 31*a*, 31*b* so that each pressure switch 11 in a serial arrangement contacts a separate conductor 31. Conductors 31 are composed of materials known within the art and should have sufficient strength to resist deformation when a mechanical load is applied. Thereafter, an insulator 32 is placed in contact with and attached or fixed to each conductor 31. A typical insulator 32 is a planar element composed of an electrically nonconducting material with sufficient strength to resist deformation when a mechanical load is applied.

At least one restoration element 30 is disposed between and parallel to the serial arrangement of pressure switches 11 and electrodes 6 or 7. The restoration element 30 is attached to separate electrically nonconductive insulators 33*a*, 33*b*. Thereafter, insulators 33*a*, 33*b* are mechanically attached to, perpendicularly disposed and between the conductors 31*a*, 31*b*. Insulators 33*a*, 33*b* electrically isolate the restoration element 30 from conductors 31*a*, 31*b*. The restoration element 30 decompresses the composite 4 within each pressure switch 11, returning it to its original thickness, when the compressive mechanical load is removed from the insulators 32*a*, 32*b*. A restoration element 30 may be a mechanical spring or coil, a pneumatic device, or any similar device that provides both extension and contraction.

In preferred embodiments, an actuator 19 contacts an insulator 32. In one embodiment, at least one actuator 19 is attached or fixed to each insulator 32 opposite of said conductor 31, as shown in FIG. 5. A pair of actively opposed yet equal actuators 19*a*, 19*b* apply a mechanical load by pushing onto electrically nonconductive insulators 32*a*, 32*b* to compress the composite 4 within each pressure switch 11*a*, 11*b*, 11*c*, 11*d*, as shown in FIG. 5*b*. In another embodiment, at least two actuators 19*a*, 19*b* are mechanically attached or fixed to a pair of insulators 32*a*, 32*b*, see FIG. 6. Again, a pair of actively opposed yet equal actuators 19*a*, 19*b* apply a mechanical load by pulling on electrically nonconductive insulators 32*a*, 32*b* to compress the composite 4 within each pressure switch 11*a*, 11*b*, 11*c*, 11*d*, as shown in FIG. 6*b*.

Variations to the described embodiments also include at least two or more actively opposed actuators 19 mechanically compressing one or more current controllers 1. FIG. 7 describes a three-by-three arrangement of nine current controllers 1, however not limited to this arrangement, In such embodiments, current controllers 1 are electrically connected parallel thereby providing a total power handling capability equal to the sum of the power handling of individual units.

One or more actuators 19 may be employed to drive two or more current controllers 1. For example, a single actuator 19 or two actively opposed yet equal actuators 19 may apply a mechanically compressive load onto the current controllers 1 so that all are simultaneously compressed and decompressed. Alternatively, one or a pair of actuators 19 may apply a mechanically compressive load onto each individual current controller 1. In this embodiment, it is possible to simultaneously drive all current controllers 1 or to selectively drive a number of units.

The embodiments described above may also include a current measuring device electrically coupled before or after the current controller 1. This device provides real-time sampling of current conditions which are thereafter communicated to the actuators 19. Such monitoring devices are known within the art.

An actuator 19 is a rigid beam-like element composed of an active material capable of dimensional variations when electrically activated. For example, the actuator 19 may extend, contract, or extend and contract, as schematically represented by arrows in FIGS. 5 and 6. Extension of the actuator 19 increases the overall length of the actuator 19. Actuators 19 are composed of electrically activated devices including piezoelectric, piezoceramic, electrostrictive, magnetostrictive, and shape memory alloy materials. For example, piezoelectric and piezoceramic materials may be arranged in a planar stack along the actuator 19. Shape memory alloys are mechanically distorted by heating via electrical conduction or heat conduction from an adjacent body, one example including the composite 4 during fault condition. Alternatively, an actuator 19 may be a commercially available high-speed piezo-controlled pneumatic element comprised of a pneumatic diaphragm with pilot operated high-bypass value.

Figure 8:
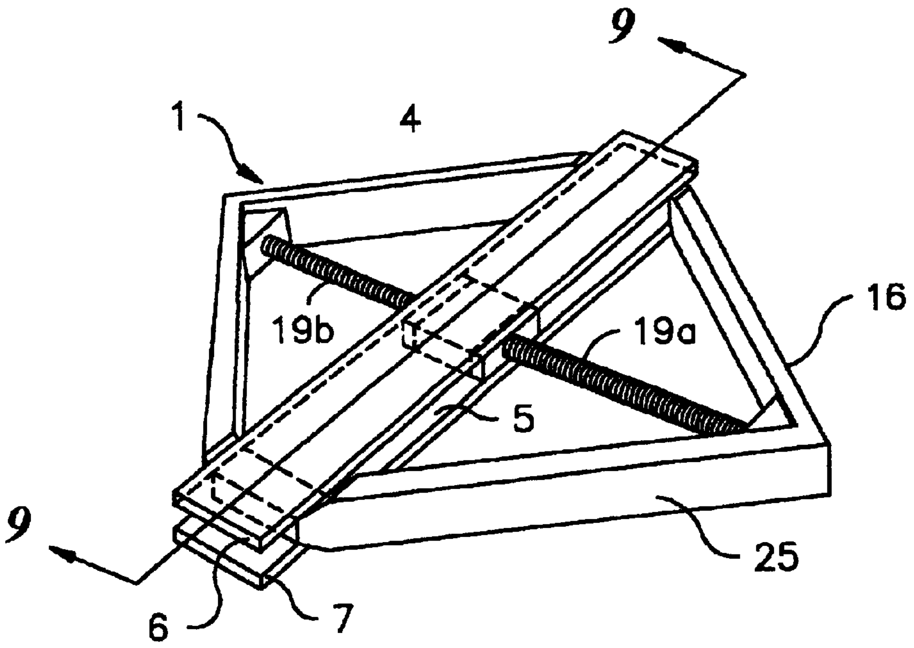
FIG. 8 is a perspective view of current control device.

An alternate embodiment of the current controller 1 is comprised of a first electrode 6, a second electrode 7, an isolator 5, at least one pressure plate 18, and a composite 4, as shown in FIG. 8. First electrode 6 and second electrode 7 are electrically conductive and separately arranged parallel about a nonconducting isolator 5 and a variably resistive composite 4. A compression mechanism 16 adjusts the force 22 acting on one or more pressure plates 18 thereby contracting and expanding the composite 4. Neither arrangement between first electrode 6 and second electrode 7 nor their function are polarity sensitive and thereby bidirectional.

Figure 10:
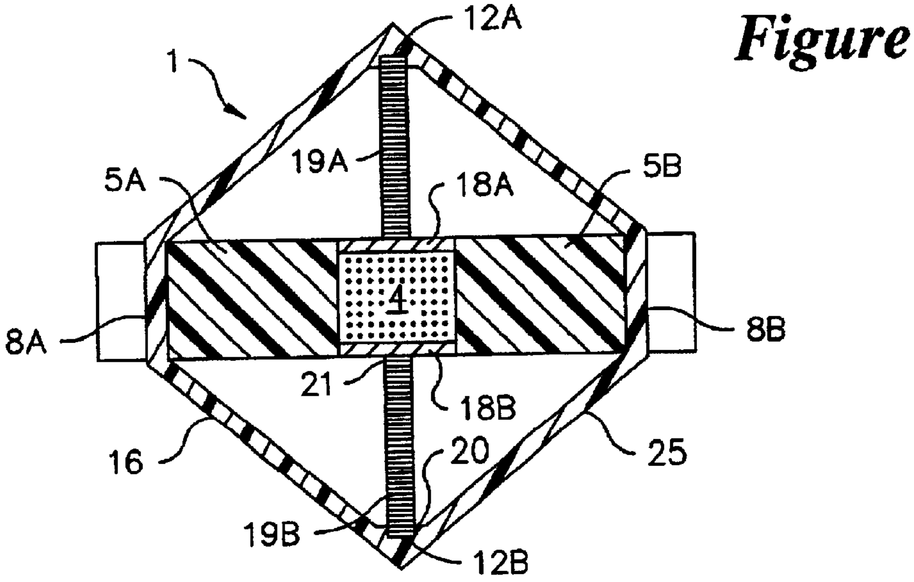
FIG. 10 is a section view showing composite confined by isolators and pressure plates.
Figure 11:
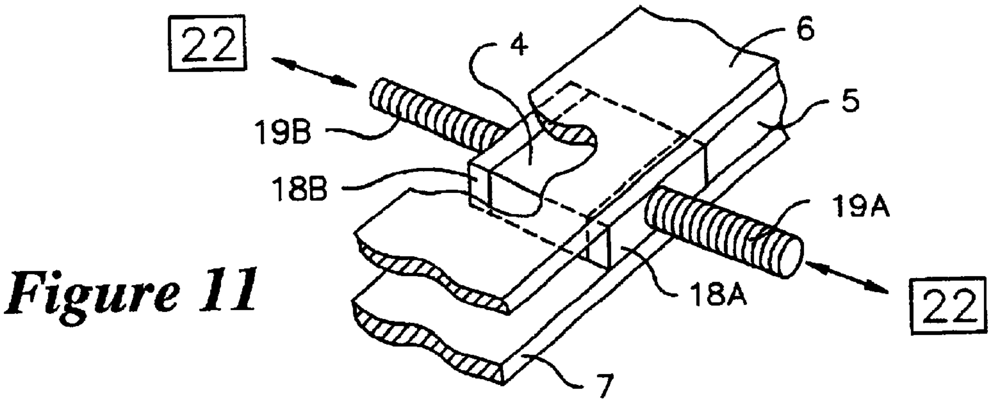
FIG. 11 is a perspective view showing composite confined within compression device.

FIG. 8 describes a compression mechanism 16 comprised of two actively-opposed actuators 19*a*, 19*b* constrained by a band 25 and attached to two movable pressure plates 18*a*, 18*b* so to compress a composite 4. In this embodiment, each actuator 19 is fixed to the band 25 at a first end 20 and to a pressure plate 18 at a second end 21, as shown in FIG. 10. Preferred pressure plates 18*a*, 18*b* are planar elements comprised of a nonconductive material, preferably a ceramic, contacting the composite 4 in a symmetric arrangement. First electrode 6 and second electrode 7, preferable planar shaped, contact composite 4 along two separate surfaces perpendicular to those contacted by pressure plates 18*a*, 18*b*. A two-part isolator 5*a*, 5*b* further contacts the composite 4 along two additional surfaces. In the described arrangement, first electrode 6, second electrode 7, pressure plates 18*a*, 18*b*, and isolator 5*a*, 5*b* surround and confine the composite 4, as shown in FIG. 11. The composite 4 is volumetrically compressed when movable pressure plates 18*a*, 18*b* displace the composite 4 by decreasing the confinement volume provided by the arrangement of immovable electrodes 6, 7, immovable isolator 5*a*, 5*b*, and pressure plates 18*a*, 18*b*.

In preferred embodiments, a pair of dynamic actuators 19*a*, 19*b* exert an equal yet opposed force 22 onto a pair of pressure plates 18*a*, 18*b* thereby compressing and pressurizing the composite 4. However, in an alternate embodiment, one active actuator 19*a* is sufficient to compress the composite 4 where opposed by a static or inactive actuator 19*b* or functionally similar element.

Actuator 19 functionality requires the actuator 19 fixed at one end to prevent movement so that linear extension and contraction within the actuator 19 is realized as movement of the pressure plate 18. In one preferred embodiment, a band 25 directs expansion of actuators 19 towards the composite 4 and prevents pressure relief by restricting outward movement of isolators 5*a*, 5*b*.

Figure 12:
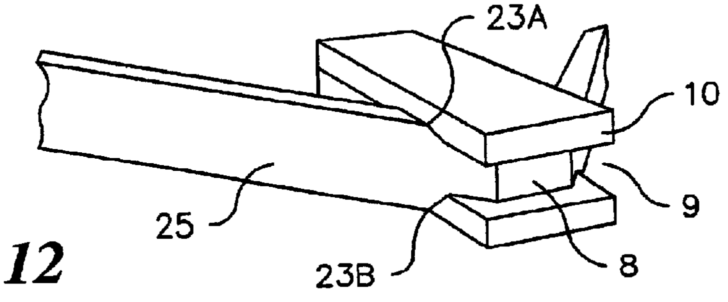
FIG. 12 is a perspective view of one end of current control device showing details of compression-release mechanism.

FIG. 10 describes a nearly rectangular band 25, however other geometric shapes are possible. A band 25 consists of a single-piece unit with attachment points for actuators 19*a*, 19*b* and isolators 5*a*, 5*b*. For example, an actuator 19 may be rigidly attached via threads, adhesive, or interference fit within a cavity 12, as shown in FIG. 10. Furthermore, the band 25 may be slidably disposed and secured via sliders 8 dimensionally similar to the channel 9 at both ends of the isolator 5, as shown in FIG. 12. Preferred embodiments of the band 25 are composed of either a metal or a high-strength fiber-based composite. The band 25 provides sufficient structural rigidity to maintain integrity of the current controller 1 during mechanical compression of the composite 4.

Figure 9:
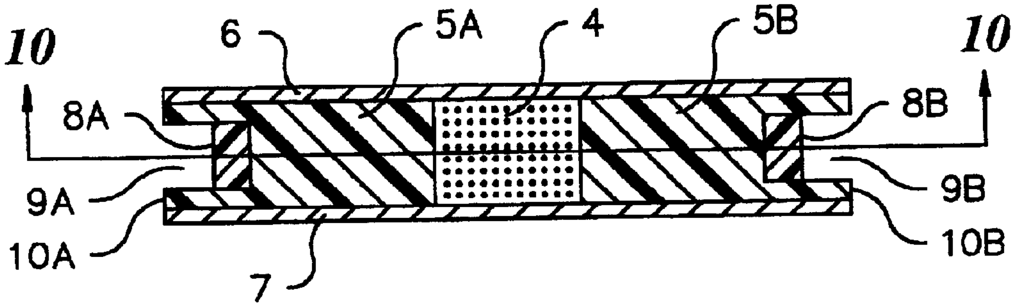
FIG. 9 is a section view showing composite confined between isolator elements.

FIGS. 9 and 10 show a dually opposed arrangement of a two-part isolator 5*a*, 5*b* about a composite 4. A typical isolator 5 may be either a single or two-part rectangular solid, having a channel 9 at two opposed terminal ends 10*a*, 10*b* for securing a slider 8. In the single-piece arrangement, a region is provided along the isolator 5 for the composite 4. The slider 8 is dimensionally smaller than other regions of the band 25 thereby forming a guide 23, as shown in FIG. 12. A pair of guides 23*a*, 23*b* along both sides of the isolator 5 restrict movement of the band 25 along the channel 9. The isolator 5 is composed of a nonconducting material, preferably a ceramic. Planar-shaped first electrode 6 and second electrode 7 are secured via fasteners or similar means to the isolator 5 further preventing movement of isolator 5, first electrode 6, and second electrode 7 and maintaining pressure within the composite 4. Actuators 19*a*, 19*b* may or may not prestress the composite 4 when assembled with band 25, isolator 5, first electrode 6, and second electrode 7.

The actuator 19 is a rigid beam-like element composed of an active material capable of dimensional variations when electrically activated. For example, the actuator 19 may extend, contract, or extend and contract, as schematically represented by arrows in FIG. 11. Extension of the actuator 19 increases the overall length of the actuator 19. Contact between band 25 and actuator 19 at the first end 20 insures any dimensional lengthening of the actuator 19 is manifested as movement of the pressure plate 18 into the composite 4. Compression and pressure within the composite 4 increase with actuator 19 length. In one preferred embodiment, mechanical loading onto the band 25 during extension of the actuator 19 is transferred to isolator 5 as a compressive load by the band 25. Contraction of the actuator 19 decreases actuator 19 length. Contact between band 25 and actuator 19 at the first end 20 insures any dimensional shortening of the actuator 19 is manifested as movement of the pressure plate 18 away from the composite 4. Compression and pressure within the composite 4 decrease as actuator 19 length shortens.

Actuators 19 are typically constructed from an active material, examples including but not limited to piezoelectric, piezoceramic, electrostrictive, magnetostrictive, and shape alloy materials. For example, piezoelectric and piezoceramic materials may be arranged in a planar stack along the actuator 19. Alternatively, actuators 19 may include commercially available high-speed piezo-controlled pneumatic element as described above.

Actuator 19 length is controlled by varying electrical current to a piezoelectric, piezoceramic, and electrostrictive element or magnetic field within a magnetostrictive element based on current flow conditions across the current controller 1 as measured by equipment known within the art. For example, current may be applied to lengthen two actively opposed piezoelectric-based actuators 19*a*, 19*b* thereby compressing a pressure conduction composite 4 and allowing current flow through the current controller 1. Upon reaching a fault condition, current to the actuators 19*a*, 19*b* is terminated shortening the actuators 19*a*, 19*b* and interrupting current flow through the current controller 1. In an other example, a pressure conduction composite 4 is prestressed by two actively-opposed piezoceramic-based actuators 19*a*, 19*b*. Upon measuring a fault, current is applied to the actuators 19*a*, 19*b* shortening the actuators 19*a*, 19*b* and interrupting current flow across the current controller 1. The control circuit regulating current flow to actuators 19*a*, 19*b* is readily understood by one in the art.

The description above indicates that a great degree of flexibility is offered in terms of the present invention. Although embodiments have been described in considerable detail with reference to certain preferred versions thereof, other versions are possible. Therefore, the spirit and scope of the appended claims should not be limited to the description of the preferred versions contained herein.

What is claimed is:

1. A current control device comprising:

(a) two electrodes;

(b) an electrically nonconductive isolator;

(c) at least one pressure plate electrically nonconductive and movable;

(d) at least one actuator, each said actuator attached at a first end to said pressure plate;

(e) a band whereon is fixed said at least one actuator at a second end and slidable attached to said isolator, said band restricting movement of said actuator at said second end, said band communicating a mechanical load to said isolator when said actuator is extended; and (f) a pressure conduction composite, said pressure conduction composite and said isolator disposed between said electrodes, said pressure conduction composite contacting said electrodes, said isolator, and said at least one pressure plate.

2. The current control device as in claim 1, wherein said pressure conduction composite is porous.

3. The current control device as in claim 1, wherein said actuator is comprised of a piezoelectric material.

4. The circuit protect device as in claim 1, wherein said actuator is comprised of a piezoceramic material.

5. The circuit protect device as in claim 1, wherein said actuator is comprised of an electrostrictive material.

6. The current control device as in claim 1, wherein said actuator is comprised of a magnetostrictive material.

7. The current control device as in claim 1, wherein said actuator is comprised of a shape memory alloy.

8. The current control device as in claim 1, wherein said actuator is a piezo-controlled pneumatic device.

* * * * *

UNITED STATES PATENT AND TRADEMARK OFFICE

CERTIFICATE OF CORRECTION

PATENT NO. : 6,798,331 B2 Page 1 of 1
DATED : September 28, 2004
INVENTOR(S) : Bower et al.

It is certified that error appears in the above-identified patent and that said Letters Patent is hereby corrected as shown below:

Column 4,
Line 9, delete “1”
Line 9, insert -- 11 --

Column 7,
Line 38, delete second “,”
Line 38, insert -- . --

Signed and Sealed this

Twenty-eighth Day of December, 2004

JON W. DUDAS
*Director of the United States Patent and Trademark Office*